(12) United States Patent
Burkett et al.

(10) Patent No.: US 12,525,461 B2
(45) Date of Patent: Jan. 13, 2026

(54) HARD MASK LIFTOFF PROCESSES

(71) Applicant: Google LLC, Mountain View, CA (US)

(72) Inventors: Brian James Burkett, Santa Barbara, CA (US); John Mark Kreikebaum, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 258 days.

(21) Appl. No.: 17/962,144

(22) Filed: Oct. 7, 2022

(65) Prior Publication Data

US 2023/0114700 A1    Apr. 13, 2023

Related U.S. Application Data

(60) Provisional application No. 63/253,356, filed on Oct. 7, 2021.

(51) Int. Cl.
| | |
|---|---|
| *H01L 21/308* | (2006.01) |
| *H01L 21/02* | (2006.01) |
| *H01L 21/033* | (2006.01) |
| *H01L 21/3205* | (2006.01) |
| *H01L 21/324* | (2006.01) |
| *H10N 60/01* | (2023.01) |

(52) U.S. Cl.
CPC ...... *H01L 21/3086* (2013.01); *H01L 21/0206* (2013.01); *H01L 21/0334* (2013.01); *H01L 21/0337* (2013.01); *H01L 21/3081* (2013.01); *H01L 21/32051* (2013.01); *H01L 21/324* (2013.01); *H01L 21/0331* (2013.01); *H10N 60/0912* (2023.02)

(58) Field of Classification Search
CPC ............. H01L 21/3086; H01L 21/0206; H01L 21/0334; H01L 21/0337; H01L 21/3081; H01L 21/32051; H01L 21/324; H01L 21/0331; H02N 60/0912
USPC .......................................................... 438/689
See application file for complete search history.

(56) References Cited

U.S. PATENT DOCUMENTS

| | | | | |
|---|---|---|---|---|
| 5,554,488 | A * | 9/1996 | Rioux | ................. H01L 21/0331 257/E21.034 |
| 11,600,763 | B2 * | 3/2023 | Burkett | .................. G06N 10/40 |

(Continued)

FOREIGN PATENT DOCUMENTS

| | | | | |
|---|---|---|---|---|
| CN | 109979806 | A * | 7/2019 | ............... G03F 1/20 |
| CN | 113257988 | | 8/2021 | |

(Continued)

OTHER PUBLICATIONS

CN 113257988 A—printout of patent family members of CN 11325788 A (Year: 2021).*

(Continued)

*Primary Examiner* — Anita K Alanko
(74) *Attorney, Agent, or Firm* — Fish & Richardson P.C.

(57) ABSTRACT

A substrate, a first layer disposed on the substrate, and a second layer disposed on the first layer are provided. An opening is etched through the second layer to the first layer. A first portion of the first layer is etched through the opening using a first etchant, to expose a surface of the substrate through the opening. A feature is deposited on the surface of the substrate through the opening. A second portion of the first layer is etched using a gaseous etchant, to release the substrate from the second layer.

21 Claims, 9 Drawing Sheets

(56) References Cited

U.S. PATENT DOCUMENTS

| | | | |
|---|---|---|---|
| 2011/0222179 A1* | 9/2011 | Monadgemi | G02B 6/3512 |
| | | | 427/164 |
| 2017/0084720 A1* | 3/2017 | Pollet | H01L 29/66553 |
| 2019/0244815 A1* | 8/2019 | Libsch | H01L 21/0337 |
| 2021/0313507 A1* | 10/2021 | Gao | H10N 60/12 |
| 2022/0037578 A1* | 2/2022 | Rodbell | G03F 7/038 |

FOREIGN PATENT DOCUMENTS

| | | | | | |
|---|---|---|---|---|---|
| CN | 113257988 A | * | 8/2021 | ....... | H01L 21/30608 |
| CN | 113257989 | | 8/2021 | | |
| CN | 113314661 A | * | 8/2021 | ............ | B82Y 10/00 |
| JP | 2005012236 A | * | 1/2005 | | |
| KR | 2002-0011318 A | * | 2/2002 | ....... | H01L 21/76254 |

OTHER PUBLICATIONS

English machine translation of CN 113314661A, Guo, N et al, "Method, apparatus and medium for implementing selective epitaxial growth of Josephson Junctions" Aug. 27, 2021 (Year: 2021).*

English machine translation of KR 2002-0011318 A, Lee, Tien-Hsi, "Manufacturing method of a thin film on a substrate" Feb. 8, 2002 (Year: 2002).*

English machine translation of CN 113257988 A, Alibaba Holdings, "Hardmask and method of making it, method of making Josephson junctions and superconducting circuits" Aug. 13, 2021 (Year: 2021).*

CN-109979806-A English-language description (Year: 2019).*

JP-2005012236-A English language description (Year: 2005).*

International Preliminary Report on Patentability in International Appln. No. PCT/US2022/077769, mailed on Apr. 18, 2024, 9 pages.

International Search Report and Written Opinion in International Appln. No. PCT/US2022/077769, dated Jan. 23, 2023, 12 pages.

Rueger et al., "Selective etching of SiO2 over polycrystalline silicon using CHF3 in an inductively coupled plasma reactor," J. Vac. Sci. Technol. A, Sep./Oct. 1999, 17(5):2492-2502.

signupmonkey.ece.ucsb.edu [online], "SPTS—Primaxx," Sep. 5, 2015, retrieved on Oct. 7, 2022, retrieved from URL<https://signupmonkey.ece.ucsb.edu/wiki/images/a/af/SPTS-Primaxx_uEtch_Presentation-b.pdf>, 28 pages.

* cited by examiner

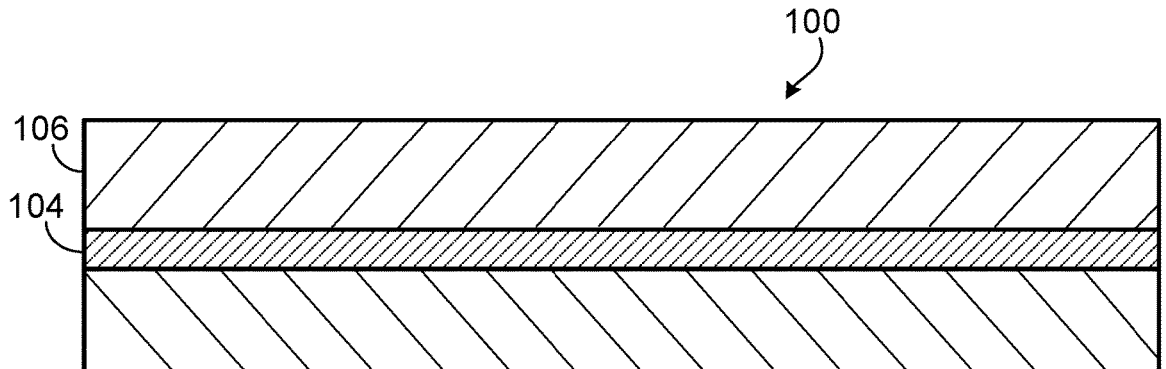
FIG. 1A
- Deposit and pattern top mask layer 110
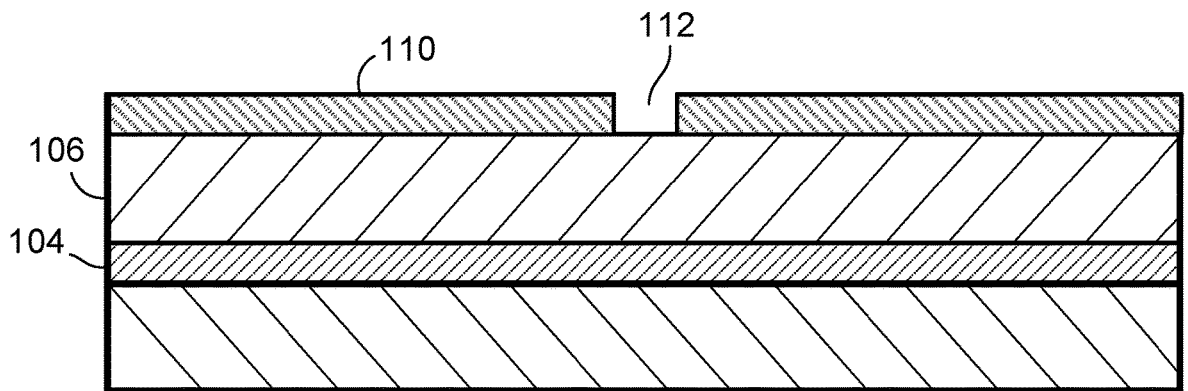
FIG. 1B
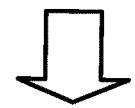
- Etch hard mask Layer 106
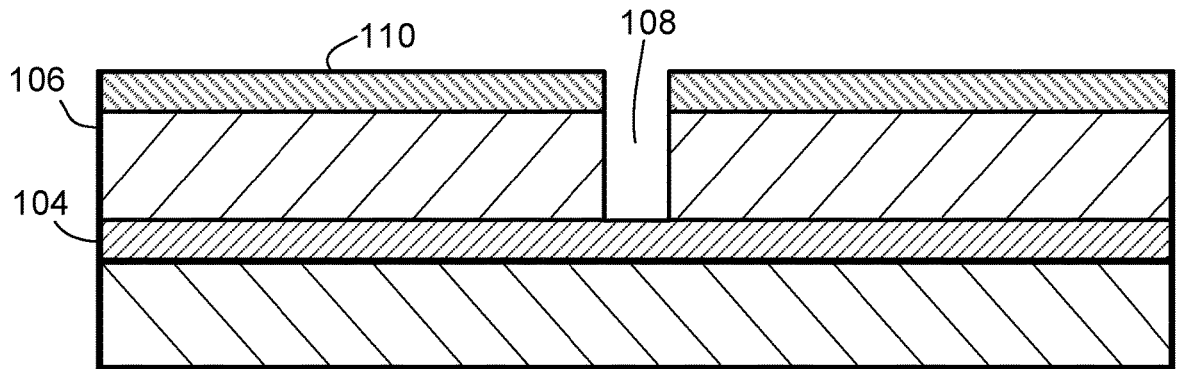
FIG. 1C
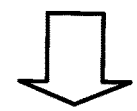
- Remove top mask layer 110
- Etch sacrificial layer 104

- Clean substrate 102
- Deposit feature 118

- Etch sacrificial layer 104

• Deposit and pattern top mask layer 206

• Etch hard mask layer 204

• Remove top mask layer 206
• Clean substrate 202
• Etch substrate 202

• Deposit feature 214

• Etch hard mask Layer 204

HARD MASK LIFTOFF PROCESSES

CROSS-REFERENCE TO RELATED APPLICATION

This application claims priority to U.S. Provisional Application No. 63/253,356, filed on Oct. 7, 2021, entitled "HARD MASK LIFTOFF PROCESSES".

FIELD OF THE DISCLOSURE

The present disclosure relates to a hard mask liftoff process for device fabrication.

BACKGROUND

Masking and liftoff processes can be used to define deposited structures, forming portions of devices for applications such as quantum computing.

SUMMARY

One aspect of this disclosure describes a fabrication method. According to the fabrication method, a substrate, a first layer disposed on the substrate, and a second layer disposed on the first layer are provided. An opening is etched through the second layer to the first layer. A first portion of the first layer is etched through the opening using a first etchant, to expose a surface of the substrate through the opening. A feature is deposited on the surface of the substrate through the opening. A second portion of the first layer is etched using a gaseous etchant, to release the substrate from the second layer.

Implementations of the fabrication method can have any one or more of at least the following characteristics.

In some implementations the first layer includes silicon oxide.

In some implementations, the second layer includes a hard mask material. In some implementations, the hard mask material includes at least one of amorphous silicon or polysilicon.

In some implementations, the gaseous etchant includes vaporous hydrofluoric acid.

In some implementations, the feature is resistant to etching by the gaseous etchant. In some implementations, the feature is susceptible to etching by a liquid analogue of the gaseous etchant.

In some implementations, the second layer is resistant to etching by the gaseous etchant.

In some implementations, the first etchant includes the gaseous etchant. In some implementations, etching the second portion of the first layer using the gaseous etchant includes etching the second portion using at least one of a higher etch chamber pressure, a higher concentration of active gaseous etching agent, or a higher etching temperature than is used to etch the first portion of the first layer using the gaseous etchant.

In some implementations, the fabrication method includes depositing the feature at least partially while the substrate is at a temperature above 150° C.

In some implementations, the feature includes a metal. In some implementations, the metal includes at least one of aluminum, niobium, or tantalum.

In some implementations, depositing the feature includes depositing the feature by physical vapor deposition or chemical deposition.

In some implementations, depositing the feature includes depositing the feature by a double-angle deposition process.

In some implementations, etching the opening includes performing a plasma etch or a wet chemical etch.

In some implementations, etching the first portion of the first layer includes etching undercuts in the first layer.

In some implementations, the fabrication method includes etching a plurality of vent holes, in addition to the opening, through the second layer to the first layer.

In some implementations, the fabrication method includes, prior to depositing the feature and after etching the first portion of the first layer, cleaning the surface of the substrate by a plasma process.

In some implementations, the fabrication method includes, prior to depositing the feature and after etching the first portion of the first layer, annealing the substrate at least partially at a temperature above 150° C.

In some implementations, etching the second portion of the first layer includes etching the first layer selectively compared to the substrate and compared to the second layer.

In some implementations, in the fabrication method, prior to etching the opening through the second layer, a top mask layer is provided on the second layer. A second opening in the top mask layer is lithographically formed. The opening through the second layer is etched through the second opening.

In another aspect, this disclosure describes another fabrication method.

According to the fabrication method, a substrate and a first layer disposed on the substrate are provided. A first portion of the first layer is etched using a first etchant, to opening an opening through the first layer to the substrate. A recess in the substrate is etched through the opening. A feature is deposited, through the opening, on a surface of the substrate in the recess. A second portion of the first layer is etched using a gaseous etchant, to remove the first layer from the substrate.

Implementations of the fabrication method can include any one or more of at least the following characteristics.

In some implementations, the first layer includes a hard mask material. In some implementations, the hard mask material includes silicon oxide.

In some implementations, the gaseous etchant includes vaporous hydrofluoric acid.

In some implementations, the feature is resistant to etching by the gaseous etchant. In some implementations, the feature is susceptible to etching by a liquid analogue of the gaseous etchant.

In some implementations, the first etchant includes the gaseous etchant.

In some implementations, the fabrication method includes depositing the feature at least partially while the substrate is at a temperature above 150° C.

In some implementations, the feature includes a metal.

In some implementations, depositing the feature includes depositing the feature by a double-angle deposition process.

In some implementations, etching the recess in the substrate includes etching undercuts in the substrate.

In some implementations, the fabrication method includes etching a plurality of vent holes, in addition to the opening, through the first layer to the substrate.

In some implementations, the fabrication method includes, prior to depositing the feature and after etching the recess in the substrate, cleaning the surface of the substrate by a plasma process.

In some implementations, the fabrication method includes, prior to depositing the feature and after etching the recess in the substrate, annealing the substrate at least partially at a temperature above 150° C.

In some implementations, etching the second portion of the first layer includes etching the first layer selectively compared to the substrate.

In another aspect, the disclosure provides a device formed by the fabrication method of either of the aspects described above.

Implementations according to this disclosure can be used to realize one or more advantages. In some implementations, processes can be performed with reduced damage to mask layers. In some implementations, substrates can be heated for cleaning and/or deposition with reduced damage to mask layers and/or with reduced contamination by mask layers. In some implementations, etches can be performed with useful selectivities and other etch characteristics. In some implementations, device materials can be retained through etch processes. In some implementations, more materials can be made available for use in devices by improving material-process compatibility. In some implementations, mask and undercut structures to facilitate double-angle deposition can be produced. In some implementations, stacks of particular materials in combination can facilitate effective hard mask patterning and use.

The details of one or more implementations are set forth in the accompanying drawings and the description below. Other aspects, features and advantages will be apparent from the description and drawings, and from the claims.

BRIEF DESCRIPTION OF THE DRAWINGS

FIGS. 1A-1F are schematics illustrating an example fabrication process.

DETAILED DESCRIPTION

This disclosure relates to fabrication using a hard mask, for example, to fabricate quantum computing devices. Fabrication of semiconductor and other devices typically relies on "soft" mask materials, e.g., masks composed of polymeric photoresists or comparable materials. However, the use of soft mask materials can introduce problems such as contamination, temperature incompatibilities, treatment incompatibilities, and chemical incompatibilities. As described herein, a hard mask process can allow for a wider range of materials and process steps to be used to fabricate devices. In some implementations, the hard mask process includes a gaseous etch that can provide high material selectivity and allow for the use of otherwise incompatible materials.

Figure 1D:
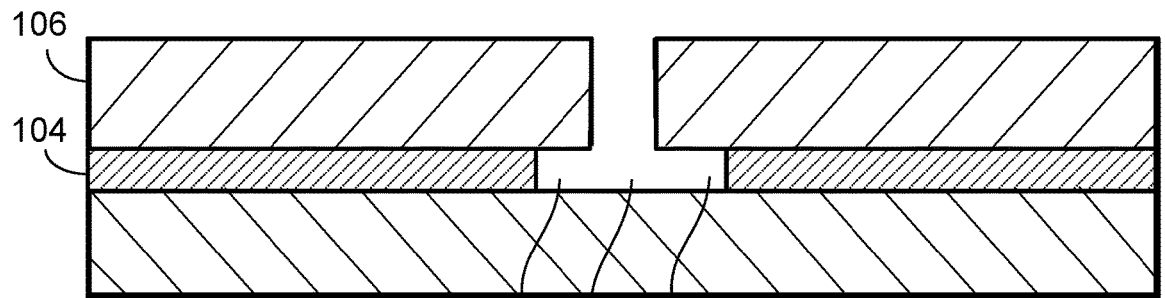

FIGS. 1A-1F illustrate an example process that incorporates a hard mask. As shown in FIG. 1A, an initial structure 100 includes a substrate 102, a sacrificial layer 104, and a hard mask layer 106. The substrate 102 can be a semiconductor substrate (e.g., a silicon substrate), an oxide or dielectric substrate (e.g., a glass substrate or a nitride substrate such as SiN), or another type of substrate. The substrate 102 is typically selected to have some compatibility with devices to be fabricated on (or bonded to) the substrate. For example, the substrate 102 can be selected to have no or small electrical and/or magnetic interactions with the devices and to provide a compatible (e.g., smooth) surface on which to form the devices. For example, in some implementations the substrate 102 has a high resistivity, e.g., a resistivity of at least $10^5$ Ω·cm. The substrate 102 can itself include one or more layers besides the additional layers disclosed explicitly herein.

The sacrificial layer 104 is etchable both i) to define openings through which device material can be deposited and ii) to eventually separate the substrate 102 from the hard mask layer 106 (e.g. to lift off the hard mask layer 106). Therefore, the sacrificial layer 104, in some implementations, is etched selectively compared to the substrate 102 and/or the hard mask layer 106 with respect to one or more etchants.

The selectivity of an etch process (referred to herein as an "etch") refers to a ratio of depth etched per unit time in one material compared to another material; the etch is said to be "selective" for the material that is etched more, compared to the material that is etched less. For example, if a certain etch process (e.g., immersion in an etch solution at a given temperature) etches silicon at 100 nm/second, and the etch process has a selectivity of 2:1 in silicon compared to in silicon dioxide, then the same etch process etches silicon dioxide at 50 nm/second.

Selective etches, according to this disclosure, can have selectivities of at least 1.5:1, at least 2:1, at least 3:1, at least 5:1, at least 10:1, at least 50:1, at least 100:1, at least 1000:1 or another ratio. In some cases, an etch is entirely selective, e.g., etches a first material while essentially not etching a second material at all.

Materials can also be described as being "susceptible" to a given etch or "resistant" to the etch, e.g., if the etch is, respectively, effective at etching the material or ineffective at etching the material, as measured by etch rate. For example, in some implementations, a material is susceptible to an etch if the etch etches the material at least at 5 nm/min, at least at 10 nm/min, at least at 20 nm/min, or at least 50 nm/min. In some implementations, a material is resistant to an etch if the etch etches the material at less than 20 nm/min, less than 10 nm/min, less than 5 nm/min, or less than 1 nm/min.

The hard mask layer 106 is etched to define openings through which the sacrificial layer 104 can be etched. Therefore, one or more etchants can be used to selectively etch the hard mask layer 106, in some implementations, compared to the sacrificial layer 104. And, as noted previously, the sacrificial layer 104 is itself etched selectively compared to the hard mask layer 106 with respect to one or more other etchants.

In some implementations, each of the sacrificial layer 104 and the hard mask layer 106 is an oxide such as silicon oxide, titanium oxide, aluminum oxide, chromium oxide, or another oxide; a nitride such as silicon nitride or aluminum nitride; a carbide such as silicon carbide; a semiconductor such as polysilicon or amorphous silicon, in some implementations doped to provide a higher conductivity; a metal such as aluminum, titanium, or platinum; or a combination thereof. The sacrificial layer 104 and the hard mask layer 106 can each be one or more of thermally grown (e.g., a thermal oxide), spin-on layers (e.g., spin-on glass), chemically-deposited layers (e.g., a plasma-enhanced chemical vapor deposited oxide, an atomic layer deposited oxide, and/or a low pressure chemical vapor-deposited (LPCVD) polysilicon layer), physical vapor-deposited layers (e.g., a sputtered oxide and/or electron-beam deposited polysilicon), or provided using another method.

In some implementations, the hard mask layer 106 has a resistivity in a range that is compatible with one or more processing steps. For example, in some implementations, the hard mask layer 106 has a relatively low resistivity (e.g., a lower resistivity than the substrate 102), which can reduce charging during electron-beam resist exposure (e.g., electron-beam lithography of a top mask layer, such as top mask layer 110). For example, the hard mask layer 106 can have a resistivity less than 100 Ω·cm, less than 10 Ω·cm, less than 1 Ω·cm, less than 0.1 Ω·cm, less than 0.01 Ω·cm, less than $10^{-3}$ Ω·cm, or less than $10^{-5}$ Ω·cm. The resistivity of the hard mask layer 106 can be greater than $10^{-7}$ Ω·cm or greater than $10^{-6}$ Ω·cm. In some implementations, the resistivity of the hard mask layer 106 is in a range defined by any two of these values. For example, a doped or otherwise non-intrinsic semiconductor, or a metal, can have a relatively low resistivity in a range defined by two of these values. A low-resistivity hard mask layer 106 can prevent or reduce charging of the top mask layer 110, e.g., during electron-beam exposure; the charging, if not reduced or prevented, may result in distorted exposure patterns.

In some implementations that incorporate heat treatment (e.g., during deposition of device material as described in further detail below), the sacrificial layer 104 and the hard mask layer 106 are each compatible with the temperatures of the heat treatment, e.g., do not significantly or at all decompose or deform at the temperatures at which the initial structure 100 is to be held. For example, in some implementations, each of the sacrificial layer 104 and the hard mask layer 106 are resistant to temperatures greater than 150° C., greater than 200° C., greater than 250° C., greater than 300° C., greater than 400° C., greater than 500° C., greater than 600° C., greater than 700° C., greater than 800° C., greater than 900° C., or another temperature. The sacrificial layer 104 and the hard mask layer 106 can be resistant to temperatures less than 300° C., less than 400° C., less than 500° C., less than 600° C., less than 700° C., less than 800° C., less than 900° C., less than 1000° C., or another temperature.

Thicknesses of the sacrificial layer 104 and the hard mask layer 106 depend on the choices of materials for those layers, the feature sizes of features fabricated using the hard mask process, thickness of final structure and other process parameters. In some implementations, the sacrificial layer 104 has a thickness of tens of nm to several microns, e.g., between 50 nm and 10 μm, between 50 nm and 1 μm, or between 100 nm and 500 nm. In some implementations, the hard mask layer 106 has a thickness of several microns, e.g., between 500 nm and 10 μm or between 1 μm and 5 μm. Other thicknesses of both the sacrificial layer 104 and the hard mask layer 106 can be used and are within the scope of this disclosure.

In some implementations, one or both of the sacrificial layer 104 or the hard mask layer 106 are transferred to their arrangement shown in FIG. 1A in a layer transfer process, such as a "smart-cut" process. In a layer transfer process, one or both of the layers 104, 106, rather than being formed on its underlying layer in a deposition process, is formed on another substrate and transferred, as a complete layer, to the underlying layer. For example, the sacrificial layer 104 can be transferred onto the substrate 102, and/or the hard mask layer 106 can be transferred onto the sacrificial layer 104. As an example of a layer transfer process, a layer, initially formed on another substrate or a portion of another substrate, can be ion-implanted with hydrogen ions at some depth in the layer. The layer can then be direct-bonded to the sacrificial layer 104. Subsequently, the layer can be fractured/split at the depth having the implanted ions (e.g., using an anneal at an elevated temperature), to leave behind a portion of the layer as the hard mask layer 106. The use of layer transfer process(es) can, in some implementations, improve layer uniformity compared to layer formation by another process.

In a hard mask layer etch, an opening 108 is etched through the hard mask layer 106 to expose the sacrificial layer 104. In some implementations, as shown in FIGS. 1B-1C, the opening 108 is etched using a top mask layer 110. The top mask layer 110 need not be (but can be) a hard mask material (e.g., those described in reference to the hard mask layer 106) but, rather, can be a soft mask material such as a resist, e.g., a polymeric photoresist or a polymeric electron-beam resist. For example, the top mask layer 110 can be provided on the hard mask layer 106 using spin deposition and patterned (e.g., using optical or electron-beam exposure followed by a developer) to create a top opening 112. Soft mask materials such as resists are compatible with this stage of fabrication because the top mask layer 110 can be removed before at least some subsequent processing steps that can be incompatible with soft mask materials, e.g., deposition of device material with in-situ heating.

To form the top opening 112, the top mask layer 110 is etched selectively compared to the hard mask layer 106. For example, in implementations where the top mask layer 110 is a resist, the resist developer is an etchant that is selective to exposed or unexposed portions of the top mask layer 110 compared to the hard mask layer 106, depending on whether the resist is a positive resist or a negative resist. Subsequently, the opening 108 is etched through the top opening 112. In some implementations, after the top opening 112 is formed, the exposed surface of the hard mask layer 106 is cleaned, e.g., by plasma cleaning or chemical cleaning, to provide a clean surface for forming the opening 108.

In some implementations, such as implementations in which the top opening 112 is formed by electron-beam lithography, a low-resistivity anti-charging layer can be included, e.g., between the top mask layer 110 and the hard mask layer 106. For example, the anti-charging layer can be a metal layer having a thickness of at least 3 nm, at least 5 nm, or at least 10 nm, in various implementations. In some implementations, the anti-charging layer has a thickness less than 100 nm. As described for low-resistivity hard mask layers 106 above, the anti-charging layer can prevent or reduce charging of the top mask layer 110.

Etching of the opening 108 in the hard mask layer etch (e.g., through an already-formed top opening 112 in the top mask layer 110) can be performed using a plasma etch, such as a reactive ion etch. For example, polysilicon can be etched using an $SF_6$-based etch, a Bosch etch process, or another method. In some implementations, the opening 108 is etched using a wet etch, e.g., a nitric acid-including etchant, potassium hydroxide (KOH), ethylenediamine pyrocatechol (EDP), and/or tetramethylammonium hydroxide (TMAH). In some implementations, the opening 108 is etched by a physical etch such as an ion mill process. In some implementations, the opening 108 is etched using a gaseous etch, such as a xenon difluoride ($XeF_2$) etch or vaporous hydrofluoric acid (VHF) etch; gaseous etches are described in further detail below. In some implementations, to provide improved controllability of subsequent sacrificial layer etch(es), the hard mask layer etch is anisotropic. A $CHF_3/SF_6$ plasma etch, a $C_4F_8/SF_6/CF_4$ plasma etch, a $CHF_3/O_2$, or a Cl-based plasma etch can provide anisotropicity in silicon, while some $SF_6$-containing plasma etches (e.g., predominantly $SF_6$ etches), wet chemical etches, and $XeF_2$ gaseous etches can provide isotropicity in silicon, to give several examples.

The hard mask layer etch used to create the opening 108 is selective to the hard mask layer compared to the top mask layer 110. In some implementations, this etch is selective to the hard mask layer 106 compared to the sacrificial layer 104, such that, following this etch, the sacrificial layer 104 is exposed in the opening 108 as shown in FIG. 1C. However, in some implementations, the etch of the hard mask layer 106 also at least partially etches the sacrificial layer 104. This can cause the substrate 102 to be directly exposed by joint etching of the hard mask layer 106 and the sacrificial layer 104. To avoid separation of the hard mask layer 106 and the substrate 102 at this stage, in some implementations such an etch can be an anisotropic etch (e.g., an anisotropic plasma etch) that etches an opening vertically through the sacrificial layer 104 without significantly etching sideways beyond the opening 108 in the hard mask layer 106. In some implementations, this etch can be anisotropic for the hard mask layer 106 but isotropic for the sacrificial layer 104 and also etch the sacrificial layer 104 faster than the hard mask layer 106, e.g., based on different materials of the hard mask layer 106 and the sacrificial layer 104. This can create undercuts in the sacrificial layer 104 even without a separate etching process for the sacrificial layer. In some implementations, an anisotropic etch can be used to etch through both the hard mask layer 106 and the sacrificial layer 104, and a subsequent isotropic etch, selective to the sacrificial layer 104 compared to the hard mask layer 106, produces undercuts in the sacrificial layer 104.

Returning to the example implementation of FIGS. 1A-1F, as shown in FIG. 1D, the top mask layer 110 is optionally removed, e.g., using a resist-stripping solvent, acid, or base, and/or a resist-removal plasma etch such as an ashing etch. In addition, the sacrificial layer 104, in a first sacrificial layer etch, is etched selectively compared to the hard mask layer 106 and the substrate 102, to create an opening 114 in the sacrificial layer 104 and expose a surface of the substrate 102. In the example shown in FIG. 1D, this first sacrificial layer etch is at least somewhat isotropic, such that undercuts 116 are etched in sidewalls of the sacrificial layer 104. The creation of these undercuts 116 can be advantageous, e.g., to create additional exposed surface area of the substrate 102 and/or to allow for the creation of particular device features by subsequent deposition, e.g., by double angle deposition. The undercuts 116 can have widths, in various implementations, of between 10 nm and 5 µm, such as between 50 nm and 1 µm, or another width. In some implementations, the undercuts 116 correspond to bridges formed by the hard mask layer 106, such as when two undercuts meet during etching to leave a suspended overhanging hard mask bridge with no sacrificial layer underneath.

Examples of isotropic etches include wet chemical etches, vapor etches, and some plasma etches. Besides the example wet chemical etches described in reference to the hard mask layer etch, additional examples include other acid etchants (e.g., HF to etch dielectrics such as silicon oxide). In some implementations where isotropicity is not required or desired, the opening 114 in the sacrificial layer 104 can be formed by an anisotropic etch, e.g., an anisotropic plasma etch. In some implementations, the etch that etches the sacrificial layer 104 also removes the top mask layer 110.

In one notable class of implementations, the sacrificial layer 104 is etched by a gaseous etchant such as VHF or $XeF_2$. In some implementations of VHF etching, an alcohol vapor (e.g., methanol, ethanol, 1-propanol, or IPA) is introduced with the VHF, which can help activate a VHF-sacrificial layer 104 etching reaction. Gaseous etchants, which are generally isotropic, can provide one or more advantages over comparable other isotropic etch types, e.g., wet (liquid) etches. First, while wet etchants often leave behind contaminants and residues that can be difficult to remove, gaseous etchants tend to leave behind cleaner surfaces. This can improve undercut etching and reduce possible stiction between the substrate 102 and the hard mask layer 106 in the undercuts 116. Second, in some implementations, gaseous etchants have high mobility along the surface of the substrate 102 and/or the underside of the hard mask layer 106, allowing for deeper, more quickly-etched undercuts than would be possible using a wet etchant. Third, in some implementations, a given gaseous etchant will have different etch selectivities than a liquid analogue of the gaseous etchant. For example, metallic aluminum is susceptible to liquid HF etches but resistant to VHF etches.

In some implementations, prior to deposition of a feature on the substrate 102 (as described in further detail below), the surface of the substrate 102 is cleaned. Cleaning the substrate 102 can provide a more pristine surface for feature deposition, e.g., a surface with fewer contaminants/impurities, and can promote direct contact between the deposited feature and the underlying substrate 102. In quantum devices, cleaning can result in improved coherence. One or more types of cleaning can be used, together and/or sequentially. In some implementations, the substrate 102 is plasma cleaned, e.g., in an oxygen plasma. In some implementations, the substrate 102 is cleaned by immersion in a chemical solution. In some implementations, the substrate 102 is cleaned with an anneal, as described in further detail below. Some of these cleans can be incompatible with typical soft mask materials but compatible with some hard mask materials. For example, plasma cleans tend to etch away soft mask materials such as resists, whereas at least some hard mask materials (e.g., polysilicon, amorphous silicon, and silicon oxide) are resistant to at least some plasma cleans.

Figure 1E:
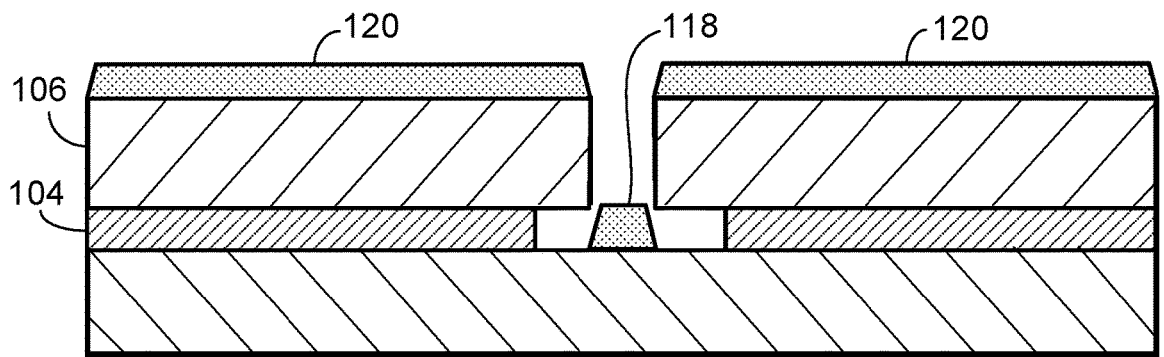

With the opening 114 etched in the sacrificial layer 104, a feature 118 formed of one or more device materials is deposited on the substrate 102 through the opening 114, as shown in FIG. 1E. The device materials are incidentally deposited on the hard mask layer 106 (e.g., forming structures 120). In some implementations, the feature 118 is formed by physical vapor deposition, e.g., electron beam evaporation or sputtering. In some implementations, the feature 118 is formed by chemical deposition, e.g., chemical vapor deposition or atomic layer deposition. Different deposition methods can be used to deposit different portions of the feature 118. Examples of device materials that can be deposited to form the feature 118 can include one or more of metals (e.g., aluminum, niobium, molybdenum, and/or tantalum), dielectrics (e.g., molybdenum oxide and/or aluminum oxide), semiconductors (e.g., silicon or gallium arsenide), and/or other material types.

In some implementations, the feature 118 is formed using double angle deposition method. In double angle deposition, using an undercut/bridge structure (in this case, formed by the hard mask layer 106), device material is deposited at two or more angles with respect to a given orientation of the substrate 102, with a high mean free path of the deposited device material, such that the undercut/bridge shadows different portions of the substrate 102 for different deposition angles. For example, a first angled deposition process can be performed to deposit a first layer, the substrate can be rotated (e.g., rotated) 90°, and a second angled deposition process can be performed to deposit a second layer. Two or more layers can be overlaid on one another with precise, self-aligned geometry. Double-angle deposition is particularly well-suited for the fabrication of superconducting Josephson junctions, e.g., to make Al/AlO$_x$/Al junctions. The presence of the undercuts 116 (formed, for example, by a gaseous etchant) allows double-angle deposition to be performed.

In some implementations, the feature 118 is deposited at least partially while the substrate 102 is held for at least some time at an elevated temperature. For example, the substrate 102 can be held at temperatures greater than 150° C., greater than 200° C., greater than 250° C., greater than 300° C., greater than 400° C., greater than 500° C., greater than 600° C., greater than 700° C., greater than 800° C., greater than 900° C., or another temperature. The substrate 102 can be held at temperatures less than 300° C., less than 400° C., less than 500° C., less than 600° C., less than 700° C., less than 800° C., less than 900° C., less than 1000° C., or another temperature. The substrate 102 can be held at a temperature that would be incompatible with a soft mask material such as polymeric resist, e.g., a temperature that would cause significant sagging of features in the soft mask material and/or that would cause decomposition, boiling, or thermally-induced structural changes in the soft mask material. The hard mask material of the hard mask layer 106, by contrast, can be compatible with these temperatures. In some implementations, the substrate 102 is held at the elevated temperature during deposition of the feature 118, e.g., using an in-situ heating system (e.g., a heated sample chuck) integrated into a deposition system of the feature 118. In some implementations, the disclosed temperatures are not deliberately applied to the substrate 102 but, rather, occur as a by-product of deposition of the feature 118, e.g., due to radiative heating from a sputtering target or material crucible or due to the kinetic energy of device material deposition.

In some implementations, the substrate 102 is instead, or additionally, held at the elevated temperature prior to deposition of the feature 118 (e.g., is annealed as a cleaning step), which can promote formation of a clean substrate surface, as described above. Anneals can be performed in a vacuum, in an inert atmosphere such as a nitrogen atmosphere, or in another atmosphere.

Heating during material deposition can promote improved deposited material characteristics, e.g., increased crystallinity and/or purity, improved stress characteristics, a target stoichiometry, more uniform thicknesses over a deposition area (e.g., by improved surface wetting), and/or other characteristics. However, in the presence of a typical soft mask material such as a resist, the in-situ heating might also cause the above-noted types of damage to the soft mask material, along with possible higher levels of contamination from the soft mask material. Contamination from a soft mask material, whether arising from soft mask material heating/treatment or associated intrinsically with use of the soft mask material, can be associated with decreased device quality. The use of one or more hard mask materials as the hard mask layer 106 can reduce or eliminate these possible negative effects of the heating.

The use of a hard mask material for the hard mask layer 106, as opposed to a soft mask material, can also provide structural advantages for deposition of the feature 118. One such advantage relates to relative thicknesses of the mask types. Resist masks typically must be relatively thick, e.g., at least one micron in thickness. By contrast, hard mask layers can be significantly thinner, such as 100 nm or less. In cases where a feature aspect ratio is important for resulting feature sizes, such as for shadowed double-angle deposition, the thinner hard mask layer opens up additional design space. For example, if a 10:1 resist/mask thickness: opening width ratio is desirable for feature deposition, then a 10 nm-wide opening (corresponding to smaller deposited feature sizes, which can be desirable, e.g., for packing more devices into a given area) corresponds to a 100 nm-thick mask/resist layer. This thickness may not be accessible with standard photoresists.

The use of hard mask layers can also allow for higher feature aspect ratios. For example, using hard mask layers and processes as described in this disclosure, it is possible to fabricate features that are 1 μm tall and 10 nm wide by using a thick hard mask layer that has 1 μm thickness or higher. Photoresist can be deposited with that 1 μm or higher thickness, but patterning the 1 μm-thickness photoresist into 10 nm lateral feature sizes can be prohibitively difficult. By contrast, the hard mask layer processes described herein (including, e.g., pattern transfer from a top mask layer 110 that may be significantly thinner than 1 μm to a thicker hard mask layer 106) can be used to fabricate masks that are comparatively thick and have comparatively smaller feature sizes, opening up otherwise-inaccessible feature design space.

Figure 1F:
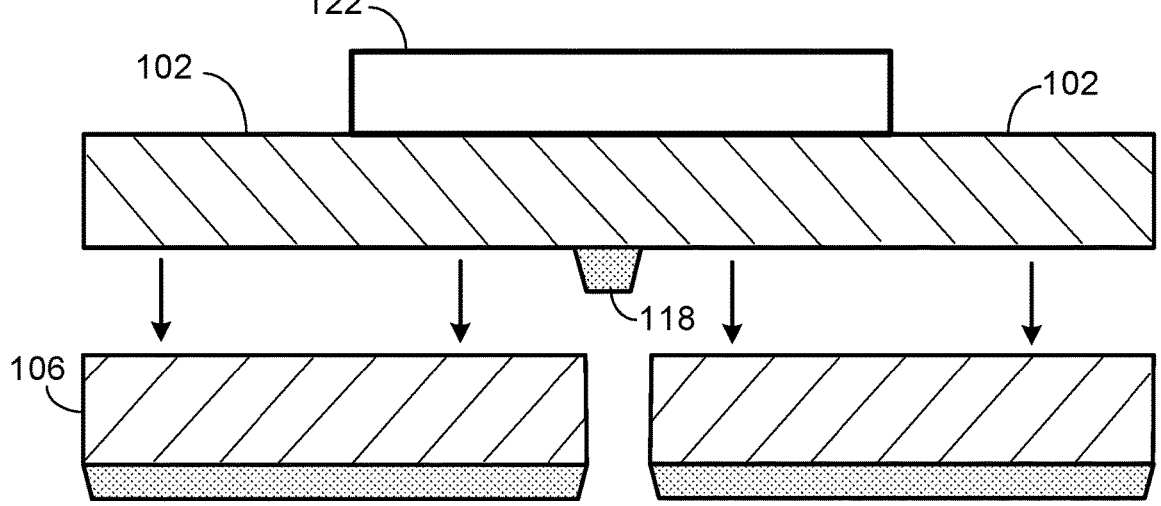

Following deposition of the feature 118, a second sacrificial layer etch is performed on the sacrificial layer 104 to release the substrate 102 from the hard mask layer 106, as shown in FIG. 1F. For example, the substrate 102 can be held in an inverted position by a chuck 122 attached to or otherwise holding a backside 124 of the substrate 102. When the sacrificial layer 104 is sufficiently etched away (e.g., fully etched away), the hard mask layer 106 is free to fall away, e.g., into a disposal bin.

In order to preserve the feature 118 deposited on the substrate 102, the second sacrificial layer etch is selective to the sacrificial layer 104 with respect to the one or more device materials of the feature 118 and with respect to the substrate 102. In some implementations, the second sacrificial layer etch is the same type of etch as the first sacrificial layer etch described in reference to FIG. 1D. For example, both the first sacrificial layer etch and the second sacrificial layer etch can use one or more of the same chemicals (e.g., VHF) in respective etchant compositions. Because the second sacrificial layer etch involves considerable amounts of undercutting/sidewall-etching to remove the sacrificial layer 104 from beneath the hard mask layer 106 and the excess deposited device material structures 120, an isotropic etch such as a gaseous etch or a wet etch can be useful for this step of the fabrication process. In addition, a gaseous etch can reduce stiction between the substrate 102 and the hard mask layer 106, promoting separation. And gaseous etches can have material selectivities that differ from analogous wet chemical etches, improving material compatibilities with the gaseous etches. The second sacrificial layer etch can, in various implementations, include any one or more of the etch types described in reference to the first sacrificial layer etch.

In some implementations, the first sacrificial layer etch and the second sacrificial layer etch share basic etching chemistries/methods but differ in particular process parameters/recipes in order to better fulfil the respective purposes of each etch. Because, in some implementations, the first sacrificial layer etch forms the undercuts 116, the first sacrificial layer etch can be relatively slow and well-controlled, to form the undercuts 116 without over-etching the sacrificial layer 104, and, in some cases, to cause the undercuts 116 to have precise widths. By contrast, the second sacrificial layer etch, in some implementations, need not be highly controlled but should simply etch quickly through the sacrificial layer 104. The respective chemistries/recipes of the first and second sacrificial layer etches can correspond to these different purposes.

In the case of a gaseous etchant, examples of tunable parameters are as follows. The second sacrificial layer etch can be performed at a higher etch chamber pressure than the first sacrificial layer etch. The difference in pressure can be caused by higher levels of the active etching agent (e.g., VHF) and/or by higher levels of an inert carrier gas and/or activation gas (e.g., nitrogen gas or vaporous ethanol, respectively). The second sacrificial layer etch can be performed with a higher concentration of active etching agent than the first sacrificial layer etch (e.g., a higher partial pressure of the active etching agent such as VHF, a higher proportion of the active etching agent in an etch gas mix, or both). The second sacrificial layer etch can be longer in duration than the first sacrificial layer etch. The second sacrificial layer etch can be performed at a higher temperature than the first sacrificial layer etch (e.g., a chamber temperature, a temperature at which the substrate is held during gaseous etching, or both).

Because the feature 118 has been deposited when the second sacrificial layer etch is performed, the second sacrificial layer etch should be compatible with the feature 118, e.g., should not etch the feature 118 significantly or at all. In some implementations, the use of a gaseous etchant can provide this compatibility. For example, aqueous HF etches metallic aluminum while VHF does not etch metallic aluminum, so, when the feature 118 includes metallic aluminum, VHF can be used for the second sacrificial layer etch without damaging the feature 118.

In one example of the process described in reference to FIGS. 1A-1F, the substrate 102 is a silicon substrate; the sacrificial layer 104 is a silicon oxide layer (e.g., a thermally-grown silicon dioxide layer); the hard mask layer 106 is a polysilicon or amorphous silicon layer (e.g., deposited by LPCVD); the top mask layer 110 is a resist layer; the hard mask layer etch is a plasma etch, a wet chemical etch, or a gaseous etch; the first and second sacrificial layer etches are VHF etches; and the feature 118 includes metallic aluminum. This combination of materials and etches provides useful etch selectivities, compatible material/etch combinations, and high-quality etch results provided by the isotropicity and cleanliness of the VHF etch. The silicon substrate, the silicon oxide, and the polysilicon or amorphous silicon are compatible with one another, e.g., form stable and clean interfaces with one another and can be provided with stresses appropriate for mechanical stability and durability. In addition, these layers can be efficiently provided in combination. For example, the silicon oxide can be thermally grown on the silicon substrate, and the polysilicon or amorphous silicon can be deposited by LPCVD without damaging the underlying substrate and oxide.

Figure 2A:
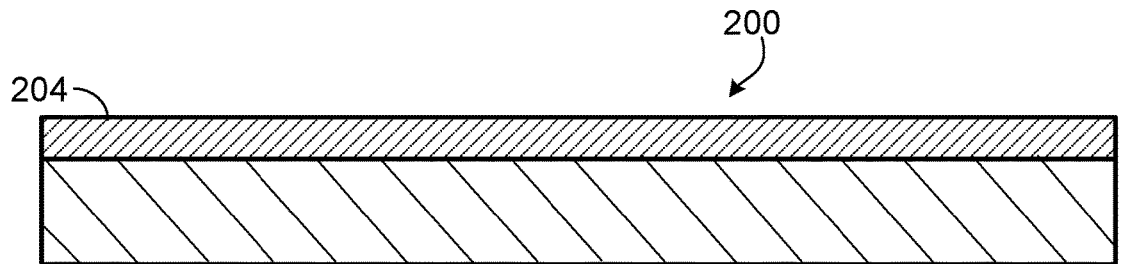
FIGS. 2A-2F are schematics illustrating an example fabrication process.

FIGS. 2A-2F illustrate another example fabrication method that includes a hard mask. As shown in FIG. 2A, an initial structure 200 includes a substrate 202 and a hard mask layer 204. The substrate 202 can have any or all of the characteristics described for substrate 102, and the hard mask layer 204 can have any or all of the characteristics described for sacrificial layer 104 or hard mask layer 106, the characteristics including at least thicknesses and material type(s). For example, in some implementations, the substrate 202 is a silicon substrate and the hard mask layer 204 is a silicon oxide layer. The hard mask layer 204 can be a polysilicon layer, an amorphous silicon layer, a nitride layer, a dielectric layer, a metal layer, or another type of layer, as described for the sacrificial layer 104 and hard mask layer 106 above.

Figure 2B:
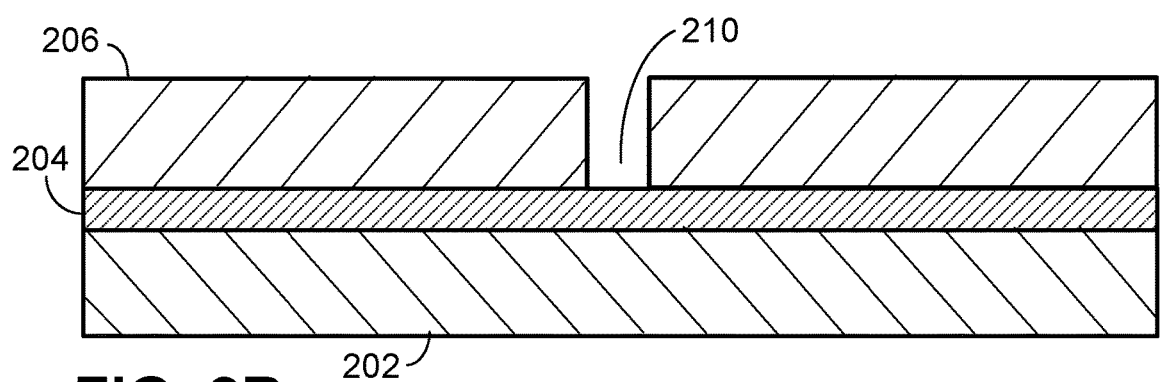

A top mask layer 206 is provided on the hard mask layer 204 and patterned to produce an opening 208 as shown in FIG. 2B. In some implementations, the top mask layer 206 is provided and patterned as described for top mask layer 110, e.g., as a resist layer patterned by photolithography or electron-beam lithography. The top mask layer 206 is selectively etched by an etchant selective to the top mask layer 206 compared to the hard mask layer 204, e.g., a developer.

Figure 2C:
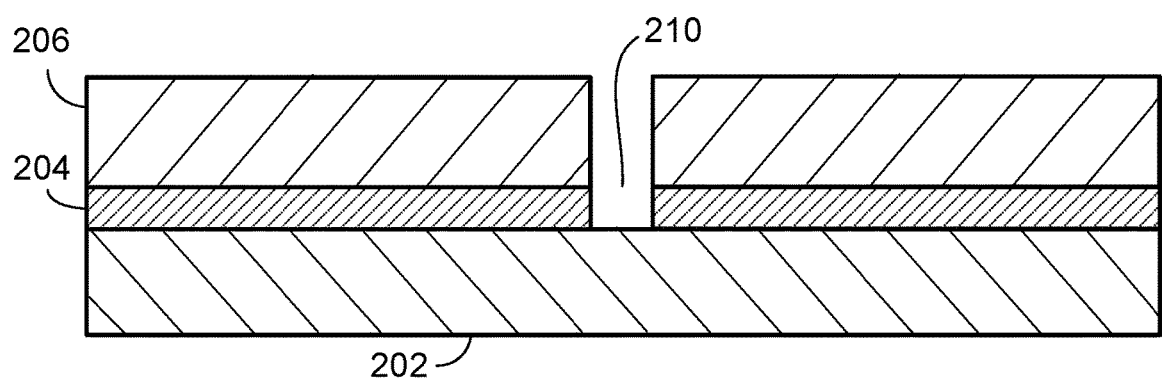

As shown in FIG. 2C, in a first hard mask layer etch, the hard mask layer 204 is etched through the opening 208, to produce an opening 210 in the hard mask layer 204. The first hard mask layer etch is selective to the hard mask layer 204 compared to the substrate 202, e.g., the first hard mask layer etch etches the hard mask layer 204 while etching the substrate 202 less or not at all. In some implementations, the first hard mask layer etch includes a $CHF_3$-containing plasma etch (e.g., $CHF_3+O_2$), which can provide or improve this selectivity, e.g., for a silicon oxide hard mask layer 204 on a silicon substrate 202. In some implementations, the first hard mask layer etch include an anisotropic plasma etch. In some implementations, the first hard mask layer etch is an isotropic etch, e.g., a wet chemical etch. For example, the first hard mask layer etch can be a liquid HF etch. The first hard mask layer etch can include any one or more of the etch types described for the first hard mask layer etch, the first sacrificial layer etch, and/or the second sacrificial layer etch described in reference to FIGS. 1A-1F, or another etch type.

With a surface of the substrate 202 exposed, in some implementations, the surface of the substrate 202 is cleaned, e.g., as described in reference to cleaning the substrate 102. For example, the substrate 202 can be cleaned by a plasma clean, a chemical solution clean, an anneal, or a combination thereof. As noted for the clean(s) of the substrate 102, some of these cleans can be incompatible with typical soft mask materials. For example, plasma cleans can etch into soft mask materials, and soft mask materials can be deformed or decomposed by anneals. The use of a hard mask material for the hard mask layer 204 can avoid these possible drawbacks. The top mask layer 206 can be removed prior to some or all cleaning steps to avoid negative interactions between the cleaning and the top mask layer 206.

Figure 2D:
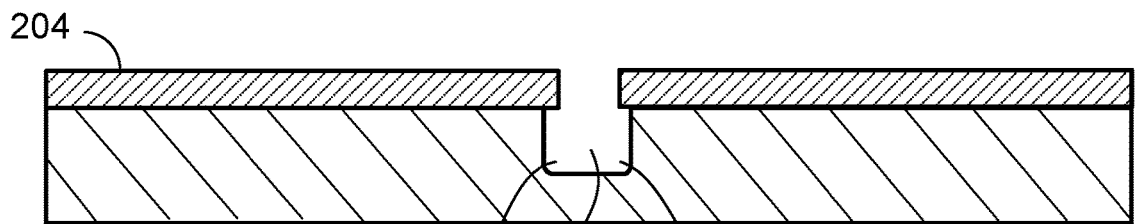

As shown in FIG. 2D, with the opening 210 etched in the hard mask layer 204, the top mask layer 206 is removed, e.g., using a resist stripper, an acid or base, and/or a plasma asher, in an etching/removal process selective to the top mask layer 206 compared to the hard mask layer 204 and/or the substrate 202. A substrate etch is performed to etch the substrate 202 and produce a recess 218 with undercuts 212 in the substrate 202. In some implementations, one or more bridges of the hard mask layer 204 are formed suspended over the substrate 202 because of the isotropicity of the substrate etch. The substrate etch is selective to the substrate 202 compared to the hard mask layer 204 in order to preserve the pattern of the opening 210 in the hard mask layer 204, and, in order to produce the undercuts 212, is at least partially isotropic. For example, the substrate etch can be a wet chemical etch, a gaseous etch, and/or an isotropic plasma etch, using any of the particular etchants described throughout this disclosure or another etchant. For example, $XeF_2$ can provide isotropic gaseous etching of silicon, and some $SF_6$-based plasma etches are also isotropic in silicon.

Note that in some implementations the substrate etch need not produce undercuts, in which case the substrate etch can be anisotropic (e.g., an anisotropic plasma etch).

Figure 2E:
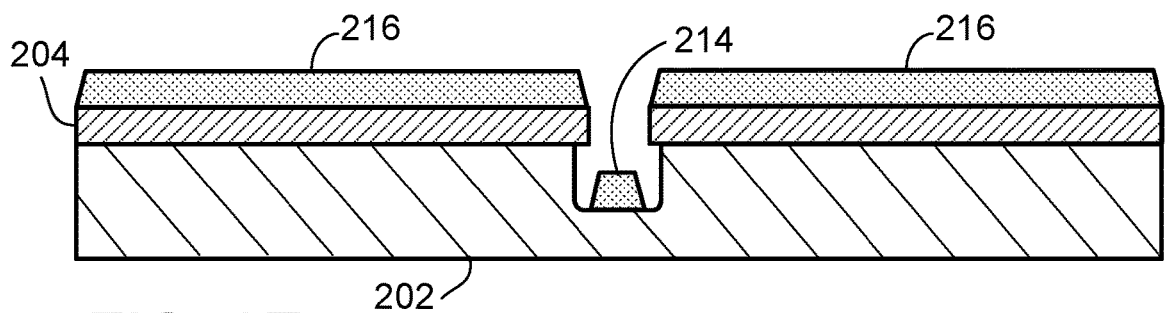

As shown in FIG. 2E, a feature 214, formed of one or more device materials, is deposited on the substrate 202 in the recess 218, and the device materials also form structures 216 deposited on the hard mask layer 204. Deposition of the feature 214 can occur as described for deposition of the feature 118, e.g., using a physical vapor deposition process or a chemical deposition process, and the one or more device materials of the feature 214 can include any one or more of the device materials described in reference to the feature 118. In some implementations, the feature 214 is deposited using a double-angle deposition process, e.g., facilitated by possible overhangs of the hard mask layer 204 over undercuts 212. In some implementations, the feature 214 is deposited at least partially while the substrate 202 is held at an elevated temperature, e.g., an elevated temperature as described for deposition of the feature 118. Devices or structures formed by the feature 214 can exhibit improved performance because of the optional pre-deposition cleaning and/or the optional during-deposition substrate heating, either or both of which can be possible because of the use of the hard mask layer 204 instead of a comparable soft mask process.

Figure 2F:
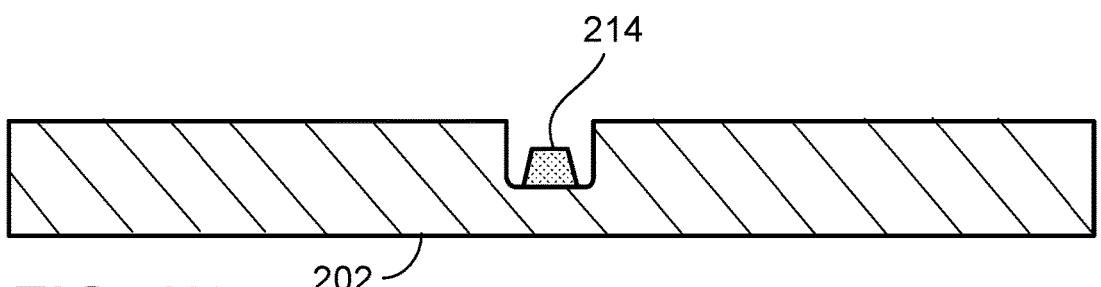

As shown in FIG. 2F, subsequent to feature 214 deposition, a second hard mask layer etch is performed to remove the hard mask layer 204 and leave the substrate 202 with the deposited feature 214. Because the hard mask layer 204 underlies the deposited structures 216, the second hard mask layer etch is isotropic. For example, the second hard mask layer etch can be a wet chemical etch and/or a gaseous etch. A gaseous etch can be particularly useful for the second hard mask layer etch, because this etch can necessitate high levels of undercutting/sidewall-etching which can be promoted by the high etchant mobility of gaseous etches. Moreover, gaseous etches can be compatible with different materials than are analogous wet chemical etches. For example, a gaseous etch used for the second hard mask layer etch may not etch the feature 214, even if a liquid analogue of the gaseous etchant would etch the feature 214.

In one example of the process described in reference to FIGS. 2A-2F, the substrate 202 is a silicon substrate; the hard mask layer 204 is a silicon oxide layer (e.g., thermal $SiO_2$); the top mask layer 206 is a resist layer; the first hard mask layer etch is a plasma etch, a wet chemical etch, or a gaseous etch; the substrate etch is an isotropic plasma etch, an isotropic wet chemical etch, or an isotropic gaseous etch; the second hard mask layer etch is a VHF etch; and the feature 214 includes metallic aluminum. This combination of materials and etches provides useful etch selectivities, compatible material/etch combinations, and high-quality etch results provided by the isotropicity and cleanliness of the VHF etch. The silicon substrate and the silicon oxide are compatible with one another, e.g., form stable and clean interfaces with one another and can be provided with stresses appropriate for mechanical stability and durability. In addition, these layers can be efficiently provided in combination, at least in that the silicon oxide can be thermally grown on the silicon substrate.

Figure 3A:
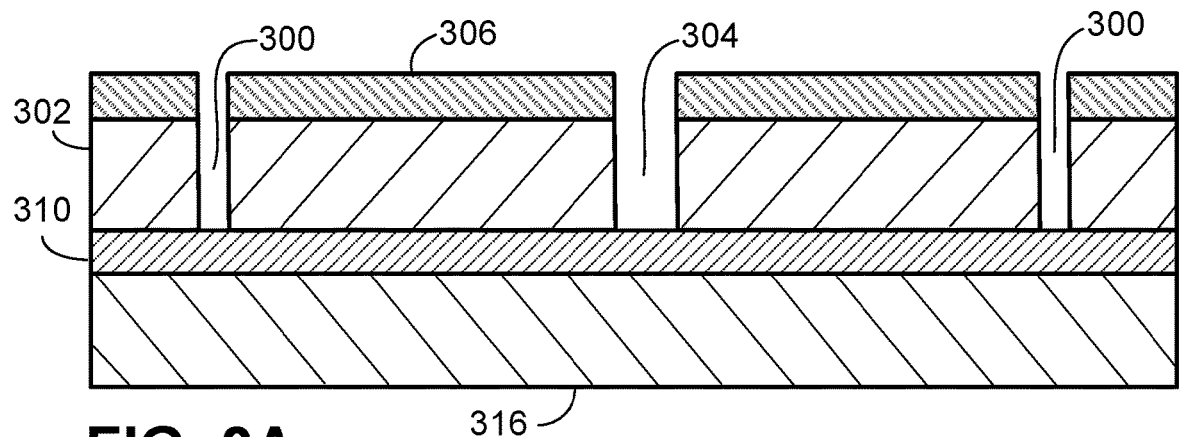
FIGS. 3A-3C are schematics illustrating an example fabrication processing incorporating vent holes.
Figure 3B:
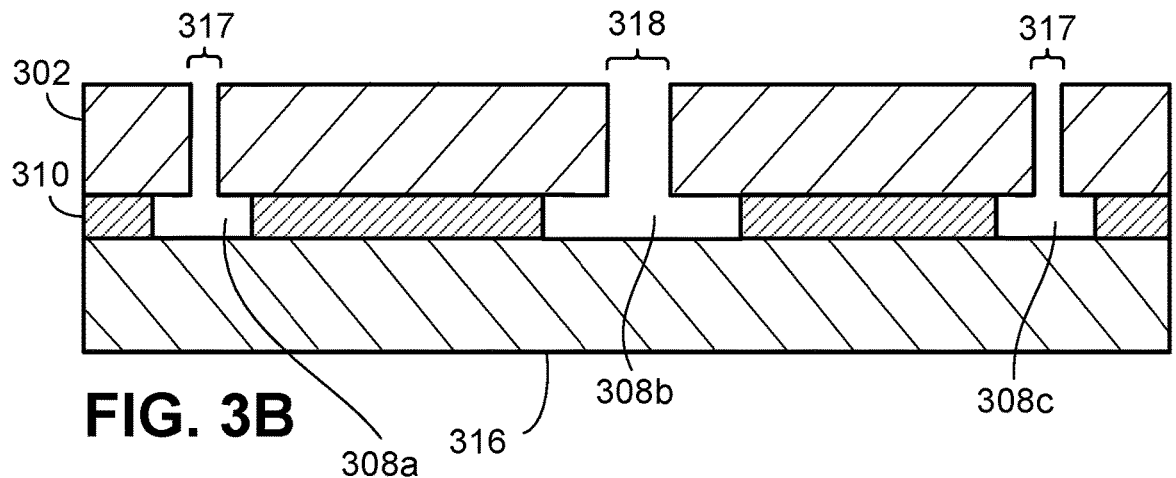
Figure 3C:
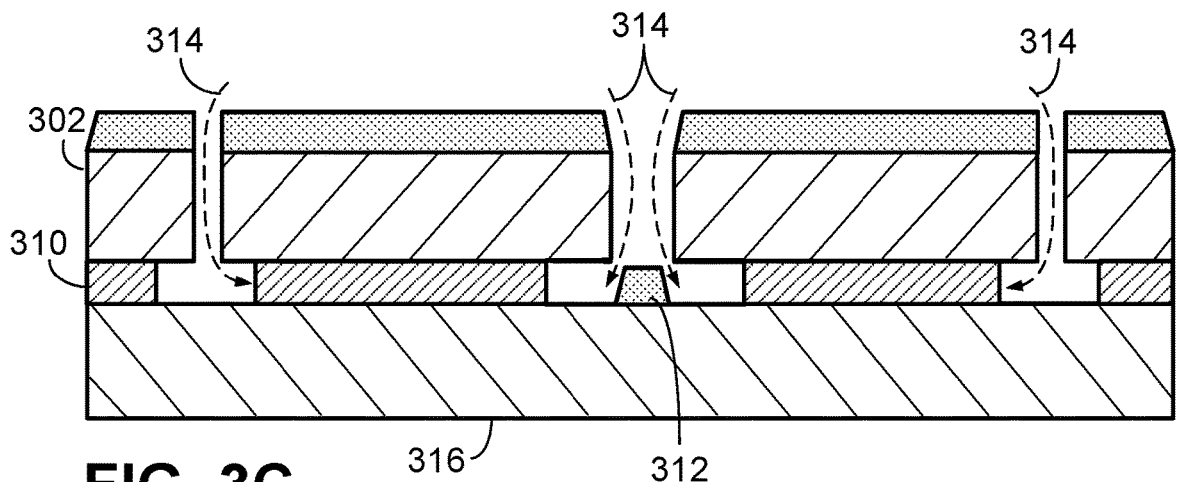

In some implementations, vent holes are used to speed up hard mask layer removal/separation (e.g., the process illustrated by FIGS. 1F and 2F). The vent holes extend from a surface of a multi-layer structure through to at least a layer removed by an isotropic etch that performs the hard mask layer removal separation. For example, as shown in FIG. 3A, two vent holes 300 are formed through a hard mask layer 302. The two vent holes 300 can be formed as part of a process that also an opening 304 through which a feature be deposited. For example, the two vent holes can be etched using a top mask layer 306 to mask an etch of the hard mask layer, as described in reference to FIG. 1C. As shown in FIG. 3B, a first sacrificial layer etch etches cavities 308a, 308b, 308c in a sacrificial layer 310 under both the vent holes 300 and the opening 304, as described in reference to FIG. 1D. As shown in FIG. 3C, subsequent to deposition of a feature 312, a second sacrificial layer etch is performed. The etchant 314 (e.g., a gaseous etchant such as VHF) etches the sacrificial layer 310 not only from cavity 308b but also from the cavities 308a, 308c formed because of the vent holes 300. This can speed up removal of the sacrificial layer 310. For example, if the etchant 314 has a lateral etch rate of 0.25 µm/min and openings 304 are 50 µm apart from one another, it will take 100 minutes to remove the sacrificial layer 310 (to form 25 µm of undercut from each opening 304). If vent holes 300 are placed halfway between the openings 304, this time is reduced to 50 minutes.

In some implementations, when the feature 312 is deposited on the substrate 316 through the opening 304, corresponding features are also deposited on the substrate 316 through any vent holes 300 that are present. For example, if the feature 312 is deposited through a "head-on" (non-angled) sputtering or evaporative process, corresponding features will be deposited through the vent holes 300. However, in some implementations, the feature 312 is deposited by angled sputtering or evaporation (e.g., a double-angle deposition process), in which case deposition through the vent holes 300 can be reduced or prevented by making the vent holes 300 thinner than the opening 304. As shown in FIGS. 3B, a width 317 of the vent holes 300 is less than a width 318 of the opening 304. The angle(s) of deposition of the feature 312 are selected such that deposited device material is blocked by sidewalls of the vent holes 300 but is able to travel down the wider opening 304.

Figure 4A:
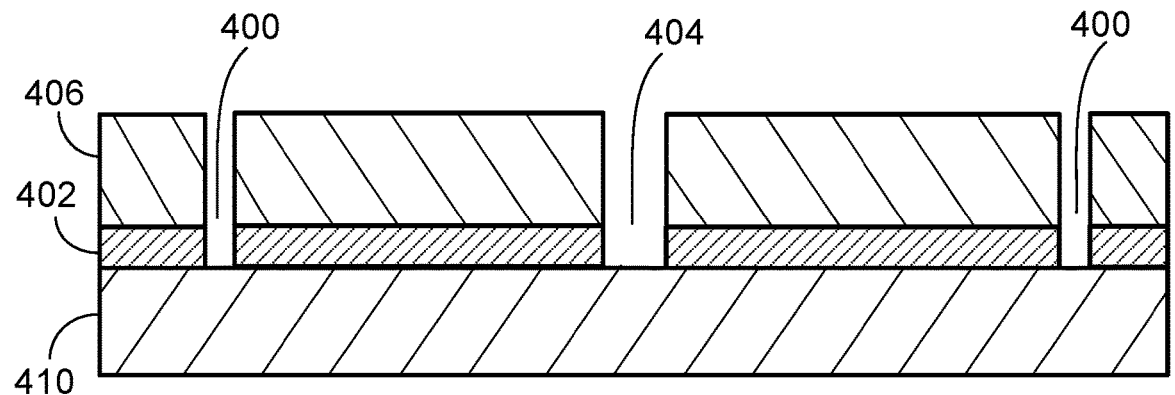
FIGS. 4A-4B are schematics illustrating an example fabrication process incorporating vent holes.
Figure 4B:
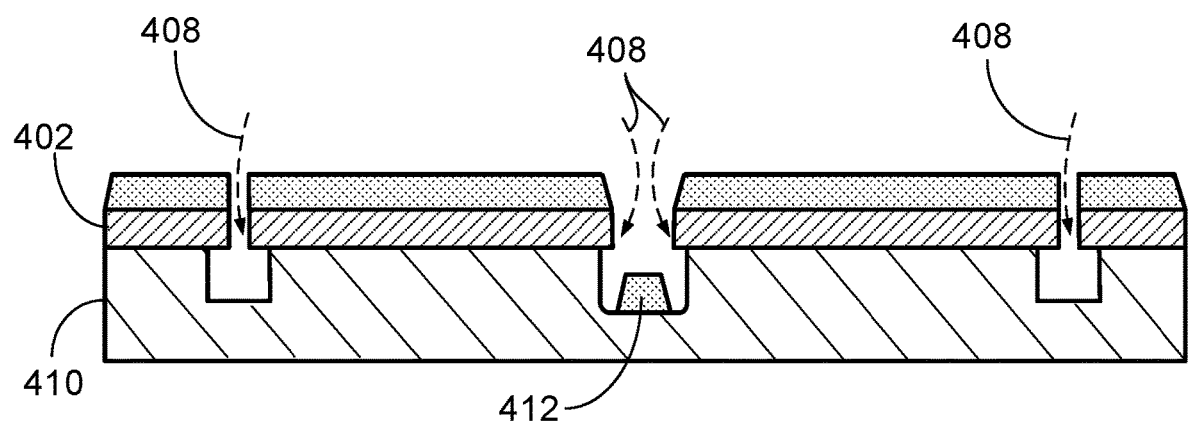

In some implementations, analogous vent holes are included in the process of FIGS. 2A-2F. As shown in FIG. 4A, vent holes 400 are created in a hard mask layer 402 by an etch process that also forms an opening 404. The etch process, in this example, is masked by a top mask layer 406. The hard mask layer 402 is disposed on a substrate 410. As shown in FIG. 4B, during subsequent isotropic etching of the hard mask layer 402 after deposition of a feature 412 (e.g., by a gaseous etchant such as VHF), etchant 408 etches not only from the opening 404 but also from the vent holes 400, hastening removal of the hard mask layer 402.

In some implementations, vent holes are formed by an etch process distinct from an etch process that forms openings through which features are to be deposited. For example, in some implementations the vent holes are formed by a lithographic and etching process subsequent to feature deposition, avoiding any possible complications arising from device material deposition through the vent holes (e.g., undesired electrical or other effects from excess device material deposited on the substrate through the vent holes).

Figure 5A:
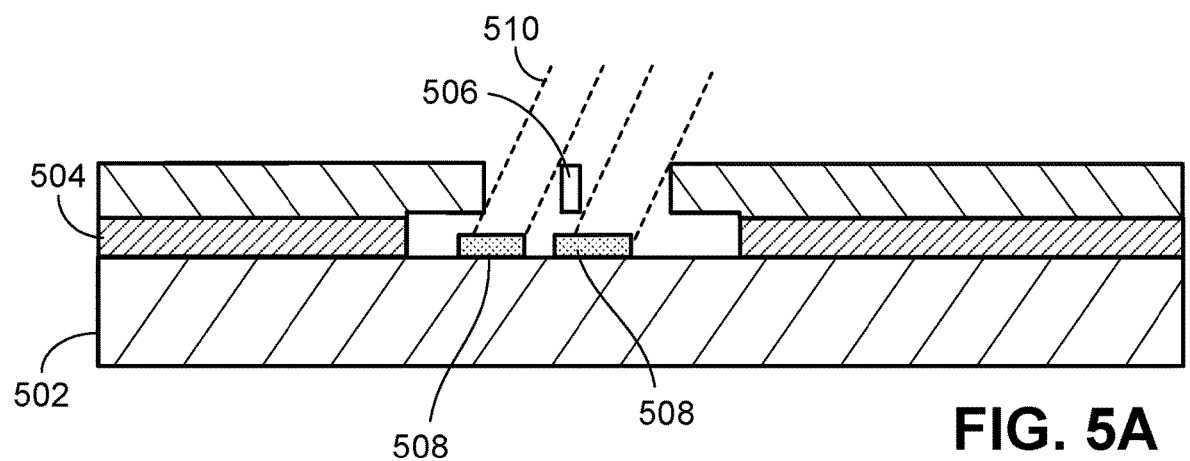
FIGS. 5A-5B are schematics illustrating an example double-angle deposition process.
Figure 5B:
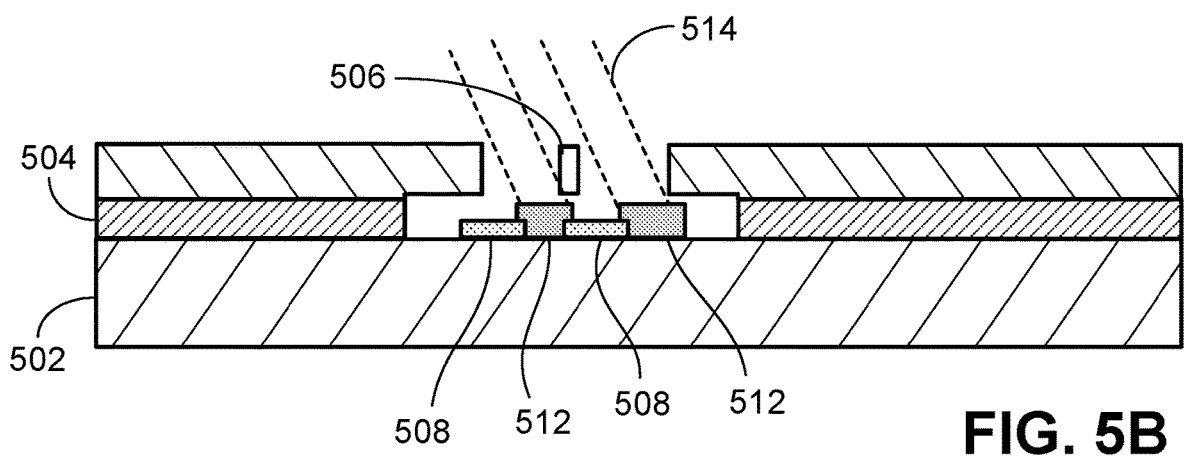

The features deposited using these hard mask techniques include, in some implementations, quantum computing devices such as Josephson junctions. FIGS. 5A-5B show an example double-angle deposition process for Josephson junction fabrication. A hard mask layer bridge 506 is suspended over a substrate 502. A first device material 508 is deposited at a first angle with respect to an orientation of the substrate 502, the first angle indicated by trajectory lines 510. Subsequently, the substrate 502, a deposition source, or both, are rotated to deposit a second device material 512 at a second angle with respect to the orientation of the substrate 502, the second angle indicated by trajectory lines 514. To fabricate a Josephson junction, the first device material 508 is a superconductor material such as aluminum or niobium, and the second device material 512 is an insulating material such as aluminum oxide. Together, these layers form a superconductor-insulator-superconductor junction, i.e., a Josephson junction. After fabrication of the junction, the hard mask layer is lifted off by etching a sacrificial layer 504 as described above. In the case of aluminum as the first device material, the aluminum would be etched by a wet chemical HF etch but is left intact by a VHF etch.

The Josephson junction can be interconnected with other electrical elements (e.g., a capacitor or an inductor) to form a qubit that stores a quantum state in a quantum computing processor. Superconductor materials can also be deposited using hard mask patterning and liftoff to form other components of a quantum computer, such as resonators, transmission lines, and other control/readout components.

Figure 6:
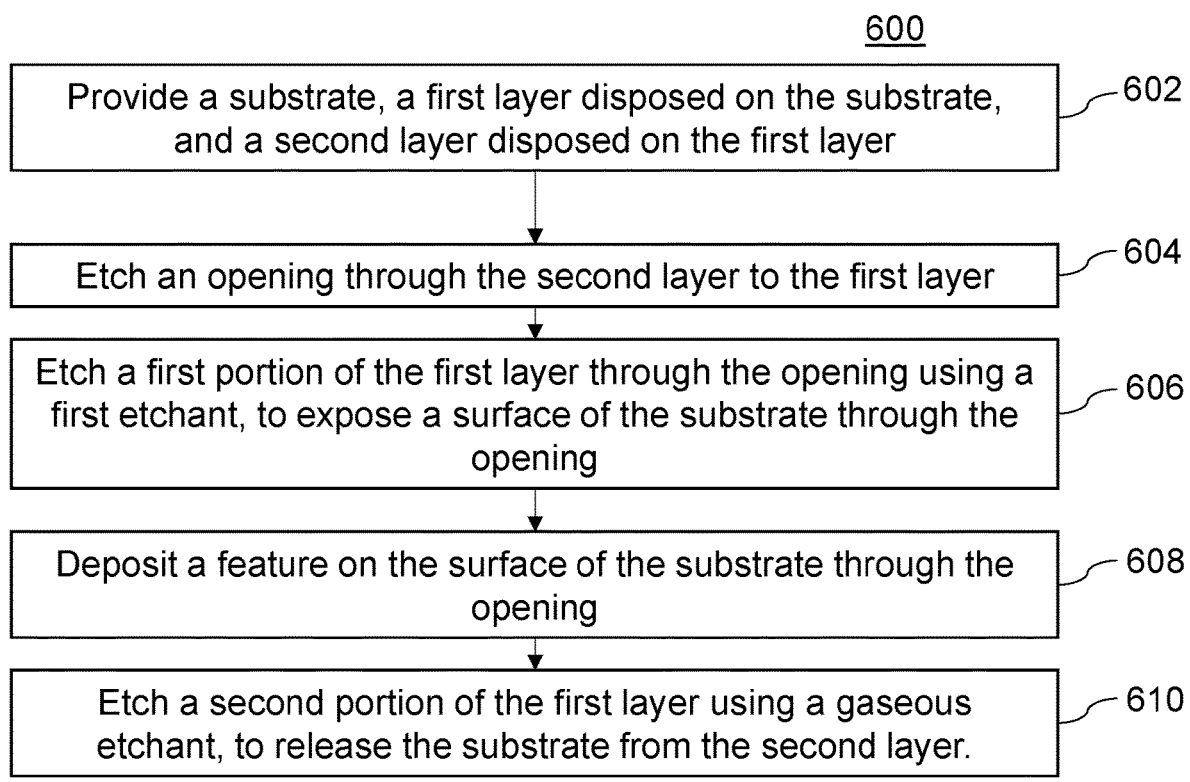
FIGS. 6-7 are diagrams illustrating example fabrication processes.

FIG. 6 shows an example fabrication process 600 according to some implementations of this disclosure. A substrate, a first layer disposed on the substrate, and a second layer disposed on the first layer are provided (602). An opening is etched through the second layer to the first layer (604). A first portion of the first layer is etched through the opening using a first etchant, to expose a surface of the substrate through the opening (606). A feature is deposited on the surface of the substrate through the opening (608). A second portion of the first layer is etched using a gaseous etchant, to release the substrate from the second layer (610). A device is thus formed comprising the substrate and the feature deposited on the substrate's surface.

Figure 7:
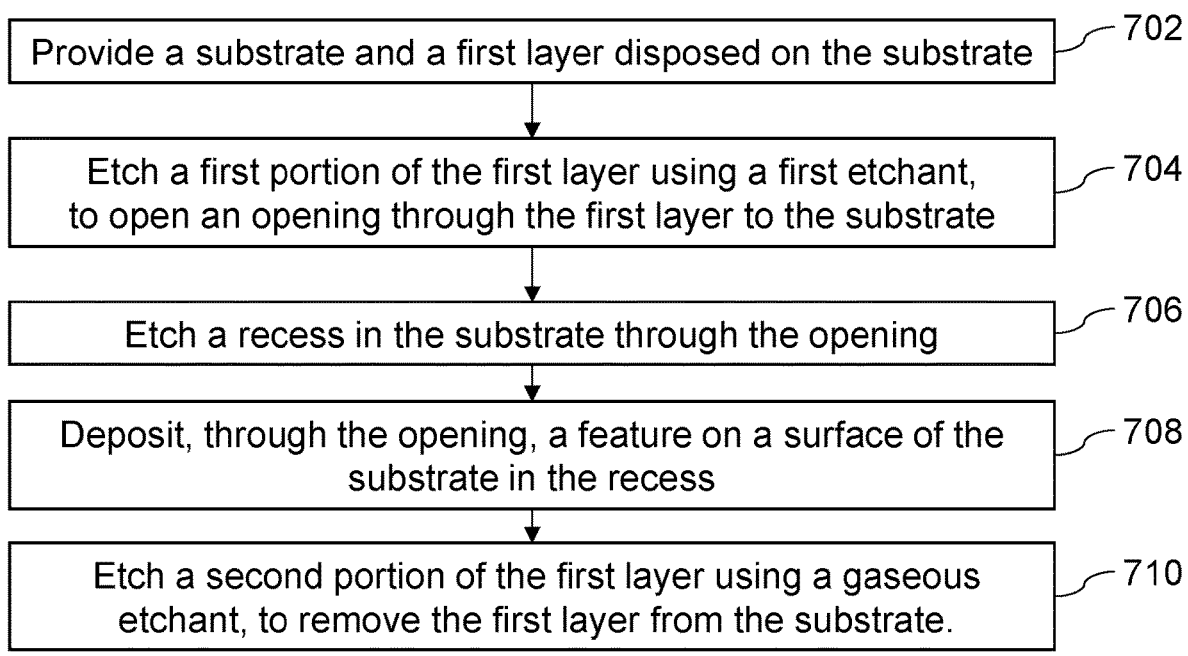

FIG. 7 shows an example fabrication process 700 according to some implementations of this disclosure. A substrate and a first layer disposed on the substrate are provided (702). A first portion of the first layer is etched using a first etchant, to opening an opening through the first layer to the substrate (704). A recess in the substrate is etched through the opening (706). A feature is deposited, through the opening, on a surface of the substrate in the recess (708). A second portion of the first layer is etched using a gaseous etchant, to remove the first layer from the substrate (710). A device is thus formed comprising the substrate and the feature deposited on the substrate's surface in the recess.

Although a few implementations have been described in detail above, other modifications are possible. Logic flows depicted in the figures do not require the particular order shown, or sequential order, to achieve desirable results. In addition, other actions can be provided, or actions can be eliminated, from the described flows, and other components can be added to, or removed from, the described systems. Accordingly, other implementations are within the scope of the following claims.

What is claimed is:

1. A fabrication method, comprising:
   providing a substrate, a first layer disposed on the substrate, and a second layer disposed on the first layer;
   etching an opening through the second layer to the first layer;
   etching a first portion of the first layer through the opening using a gaseous etchant, to expose a surface of the substrate through the opening;
   depositing a feature on the surface of the substrate through the opening; and
   etching a second portion of the first layer using the gaseous etchant, to release the substrate from the second layer,
   wherein etching the second portion of the first layer using the gaseous etchant comprises etching the second portion using at least one of a higher etch chamber pressure, a higher concentration of active gaseous etching agent, or a higher etching temperature than is used to etch the first portion of the first layer using the gaseous etchant.

2. The fabrication method of claim 1, wherein the first layer comprises silicon oxide.

3. The fabrication method of claim 1, wherein the second layer comprises a hard mask material.

4. The fabrication method of claim 3, wherein the hard mask material comprises at least one of amorphous silicon or polysilicon.

5. The fabrication method of claim 1, wherein the gaseous etchant comprises vaporous hydrofluoric acid.

6. The fabrication method of claim 1, wherein the feature is resistant to etching by the gaseous etchant.

7. The fabrication method of claim 6, wherein the feature is susceptible to etching by a liquid analogue of the gaseous etchant.

8. The fabrication method of claim 1, wherein the second layer is resistant to etching by the gaseous etchant.

9. The fabrication method of claim 1, comprising depositing the feature at least partially while the substrate is at a temperature above 150° C.

10. The fabrication method of claim 1, wherein the feature comprises a metal.

11. The fabrication method of claim 10, wherein the metal comprises at least one of aluminum, niobium, or tantalum.

12. The fabrication method of claim 1, wherein depositing the feature comprises depositing the feature by physical vapor deposition or chemical deposition.

13. The fabrication method of claim 1, wherein depositing the feature comprises depositing the feature by a double-angle deposition process.

14. The fabrication method of claim 1, wherein etching the opening comprises performing a plasma etch or a wet chemical etch.

15. The fabrication method of claim 1, wherein etching the first portion of the first layer comprises etching undercuts in the first layer.

16. The fabrication method of claim 1, comprising etching a plurality of vent holes, in addition to the opening, through the second layer to the first layer.

17. The fabrication method of claim 1, comprising, prior to depositing the feature and after etching the first portion of the first layer, cleaning the surface of the substrate by a plasma process.

18. The fabrication method of claim 1, comprising, prior to depositing the feature and after etching the first portion of the first layer, annealing the substrate at least partially at a temperature above 150° C.

19. The fabrication method of claim 1, wherein etching the second portion of the first layer comprises etching the first layer selectively compared to the substrate and compared to the second layer.

20. The fabrication method of claim 1, comprising, prior to etching the opening through the second layer:
   providing a top mask layer on the second layer;
   lithographically forming a second opening in the top mask layer; and
   etching the opening through the second layer through the second opening.

21. The fabrication method of claim 1, wherein the second layer has a resistivity between 10 Ω·cm and $10^{-6}$ Ω·cm.

* * * * *